United States Patent [19]
Rose

[11] Patent Number: 5,554,853
[45] Date of Patent: Sep. 10, 1996

[54] PRODUCING ION BEAMS SUITABLE FOR ION IMPLANTATION AND IMPROVED ION IMPLANTATION APPARATUS AND TECHNIQUES

[75] Inventor: Peter H. Rose, N. Conway, N.H.

[73] Assignee: Krytek Corporation, Danvers, Mass.

[21] Appl. No.: 402,353

[22] Filed: Mar. 10, 1995

[51] Int. Cl.[6] .................................................. H01J 37/317
[52] U.S. Cl. .................................... 250/492.21; 315/111.41
[58] Field of Search ........................... 250/492.21, 423 R, 250/427, 396 ML, 398; 315/111.81, 111.41

[56] References Cited

U.S. PATENT DOCUMENTS

| | | | |
|---|---|---|---|
| 3,445,722 | 5/1969 | Scott et al. | 315/111.41 |
| 4,151,420 | 4/1979 | Keller et al. | 250/492.21 |
| 4,276,477 | 6/1981 | Enge | 250/452.21 |
| 4,463,255 | 7/1984 | Robertson et al. | |
| 4,476,393 | 10/1984 | Taya et al. | 250/492.21 |
| 4,634,931 | 1/1987 | Toya et al. | 250/356 ML |
| 4,774,437 | 9/1988 | Helmer et al. | |
| 4,804,852 | 2/1989 | Rose et al. | |
| 4,804,879 | 2/1989 | Fukumoto | 250/492.3 |
| 4,883,968 | 11/1989 | Hipple et al. | |
| 4,943,728 | 7/1990 | Dykstra et al. | |
| 5,078,848 | 1/1992 | Anttila et al. | 204/192.38 |
| 5,160,846 | 11/1992 | Ray | 250/492.21 |
| 5,196,706 | 3/1993 | Keller et al. | 250/452.21 |
| 5,350,926 | 9/1994 | White et al. | 250/492.21 |
| 5,433,836 | 7/1995 | Martin et al. | 315/111.41 |

FOREIGN PATENT DOCUMENTS

WO93/17445 2/1993 WIPO.

OTHER PUBLICATIONS

N. Sakudo, "Microwave Ion Source for Ion Implantation", Nuclear Instruments & Methods in Physics Research, pp. 168–177, vol. 821, No. 2–4, Mar. 1987.

Lienhard Wegmann, "The Historical Development of Ion Implantation", Ion Implantation: Science and Technology pp. 3–49, 1984.

J. O. McCaldin, "Ion Beams and Solid State Physics", Nuclear Instruments and Methods 38, pp. 153–154, 1965.

Manchester et al., "Doping of Silicon By Ion Implanation", Nuclear Instruments and Methods, 38, pp. 169–174 (1965).

G. D. Alton, "Ion Sources for Accelerators in Materials Research", Nuclear Instruments and Methods in Physics Research, B73 (1993) 221–288.

Torii et al., "Very High Current ECR Ion Source for an Oxygen Ion Implanter", Nuclear Instruments & Methods in Physics Research, pp. 178–181, vol. 821, No. 2–4, Mar. 1987.

(List continued on next page.)

Primary Examiner—Bruce C. Anderson
Attorney, Agent, or Firm—Fish & Richardson P.C.

[57] ABSTRACT

A scheme for producing ions of a selected ion species and a selected ion energy comprising: an ion plasma source for generating an ion source plasma from a selected source gas and having an ion exit aperture; an extraction electrode for extracting and for accelerating ions from the exit aperture of the plasma source, the extraction electrode being positioned in the vicinity of the ion exit aperture of the ion plasma source, the ion source being biased at a potential relative to the extraction electrode to achieve a selected ion beam energy; a magnetic structure having pole faces that define a magnetic deflection gap therebetween and having an ion exit region where ions exit the magnetic deflection gap, the ion plasma source and the extraction electrode being positioned in the magnetic deflection gap so that when the magnetic structure is energized ions extracted from the plasma source corresponding to the selected species are deflected about an angular beam path trajectory of at least ninety degrees before extracted ions reach the ion exit region and exit the magnetic deflection gap. An improved scheme for implanting ions produced by the above-mentioned scheme is also disclosed.

16 Claims, 9 Drawing Sheets

OTHER PUBLICATIONS

Peter H. Rose, "A History of Commercial Implantation", Nuclear Instruments and Methods in Physics Research, pp. 1–8), B6 (1985).

Rose et al., "A High–Energy, High–Current Ion Implantation System", Nuclear Instruments and Methods in Physics Research, pp. 27–34, B6 (1985).

Andrew B. Wittkower, "The Effect of Ion Implanter Design Upon Implant Uniformity", Solid State Technology, pp. 77–80, Sep. 1982.

Ryding et al., "Features of a high–current implanter and a medium–current implanter", J. Vac, Sci. Technol., pp. 1030–1036, vol. 13, No. 5, Sep./Oct. 1976.

Bartels et al., "Ion Implantation is Here", Industrial Research, pp. 64–47, Sep. 1970.

L. Jackson Laslett, "Strong Focusing in Circular Particle Accelerators", Albert Septier, Focusing of Energized Particles, Academic Press, pp. 355–420, 1967.

Peters et al., "Space–Charge Neutralization and Studies of the Beam Plasma", Electromagnetic Separation of Isotopes in Commercial Quantities, pp. 10–35.

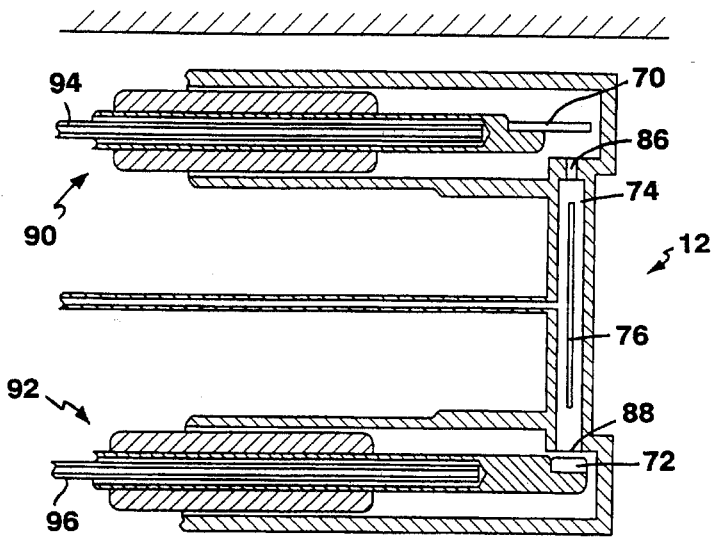
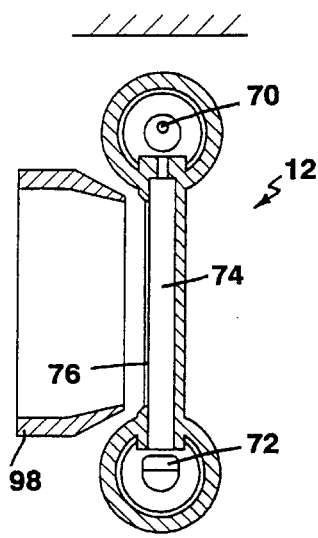
FIG. 3  FIG. 3A
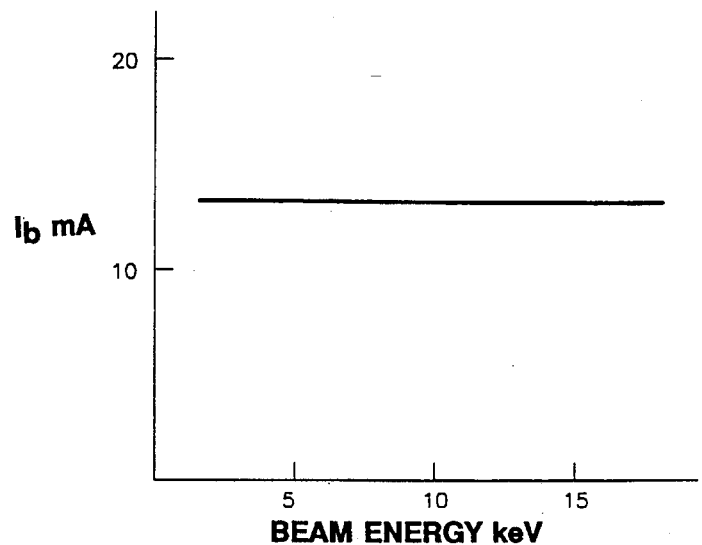
FIG. 7
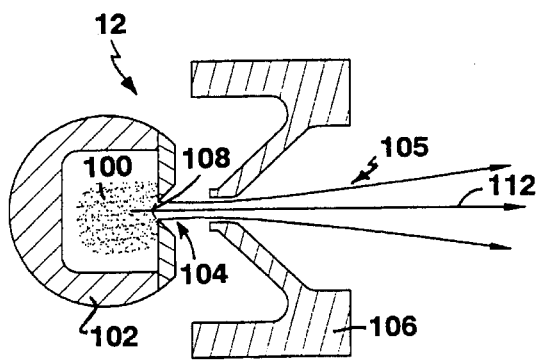
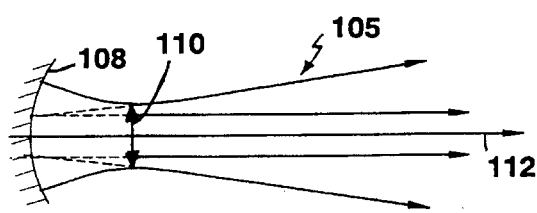
FIG. 4  FIG. 4A

PRODUCING ION BEAMS SUITABLE FOR ION IMPLANTATION AND IMPROVED ION IMPLANTATION APPARATUS AND TECHNIQUES

BACKGROUND

This invention relates to producing ion beams suitable for ion implantation and to improved ion implantation apparatus and techniques.

Ion implantation is useful for producing near surface modification of materials, but presently the principal commercial application of ion implantation is in the manufacture of large scale integrated (LSI) circuits. Generally, ions of a selected species are implanted into the surface regions of a semiconductor wafer to alter the electrical characteristics of the wafer. The depth of implantation is determined by the energy of the ions, while the throughput of the implantation process is determined by the ion beam current. As the lateral dimensions of semiconductor devices become smaller, the vertical dimensions must also be reduced. For example, in the manufacture of devices with minimum dimensions of 0.25 microns or less, certain process steps (e.g., in the creation of the source and drain regions of field effect devices) require ion beam energies as low as 1–5 key and typical ion doses of about $5 \times 10^{15}$ ions/cm$^2$.

Space-charge forces within an ion beam, however, tend to limit the beam current levels achievable at low ion beam energies. These forces cause the ions in the beam to diverge outward, producing an unmanageably large beam envelope. Space-charge blow-up is the rate at which the transverse dimension of the beam increases with distance along the beam axis. This is proportional to a mass-normalized beam perveance ($\epsilon$)

$$\epsilon = IM^{1/2}E^{-3/2} \qquad (1)$$

where I is the beam current, M is the ion mass, and E is the ion energy. For a typical ion implanter configuration, space-charge effects become limiting at a perveance of $\epsilon \sim 0.2$ (mA)(amu)$^{1/2}$(keV)$^{-3/2}$. Thus, an 80 keV arsenic beam becomes space-charge limited at a current of about 1.7 mA, while a 5 keV beam is space-charge limited at a current of only about 0.03 mA.

Referring to FIGS. 13 and 13A, space-charge effects tend to limit the performance of a typical state-of-the-art ion implanter at low beam energies. When the beam energy drops below about 10 keV, the beam current transmitted through such an ion implantation system is rapidly reduced because of beam blow-up. This significantly effects the throughput of the implanter. As shown in FIG. 13A, for a given ion dose greater than about $10^{14}$ ions/cm$^2$, selected to achieve desired electrical characteristics in an implanted wafer, the throughput drops drastically as the required dose increases for a 1 mA beam relative to a 10 mA beam.

Another consideration in the design of ion implantation equipment is surface charging of the workpiece. When a semiconductor wafer bearing one or more insulating layers passes through an ion beam, the wafer surface will become charged. Such wafers can experience dielectric breakdown when wafer charging occurs. Also, as a wafer becomes, e.g., positively charged, electrons are swept from the ion beam, increasing the space-charge forces within the beam.

SUMMARY

In one aspect, the invention features an apparatus for implanting ions of a selected ion species and a selected ion energy into a workpiece comprising: an ion plasma source for generating an ion source plasma from a selected source gas and having an ion exit aperture; an extraction electrode for extracting and for accelerating ions from the exit aperture of the plasma source, the extraction electrode being positioned in the vicinity of the ion exit aperture of the ion plasma source, the ion source being biased at a potential relative to the extraction electrode to achieve a selected ion beam energy; a magnetic structure having pole faces that define a magnetic deflection gap therebetween and having an ion exit region where ions exit the magnetic deflection gap, the ion plasma source and the extraction electrode being positioned in the magnetic deflection gap so that when the magnetic structure is energized ions extracted from the plasma source corresponding to the selected species are deflected about an angular beam path trajectory of at least ninety degrees before extracted ions reach the ion exit region and exit the magnetic deflection gap; and a stage for supporting a workpiece and for positioning the workpiece to intercept ions that exit the magnetic deflection gap for achieving implantation of intercepted ions into the workpiece.

In another aspect, the invention features an apparatus for producing a beam of ions of a selected ion species and a selected ion energy comprising: an ion plasma source for generating an ion source plasma from a selected source gas and having an ion exit aperture; an extraction electrode for extracting and for accelerating ions from the exit aperture of the plasma source, the extraction electrode being positioned in the vicinity of the ion exit aperture of the ion plasma source, the ion source being biased at a potential relative to the extraction electrode to achieve a selected ion beam energy; a magnetic structure having pole faces that define a magnetic deflection gap therebetween and having an ion exit region where ions exit the magnetic deflection gap, the ion plasma source and the extraction electrode being positioned in the magnetic deflection gap so that when the magnetic structure is energized ions extracted from the plasma source corresponding to the selected species are deflected about an angular beam path trajectory of at least ninety degrees before extracted ions reach the ion exit region and exit the magnetic deflection gap; and analyzing slits disposed outside of the magnetic structure and positioned to intercept ions that exit the magnetic deflection gap and to selectively pass intercepted ions corresponding to the selected ion species.

In another aspect the invention features a method for implanting ions of a selected ion species and a selected ion energy into a workpiece comprising the steps of: providing a plasma of ions corresponding to the selected species in a plasma source; accelerating the created ions by positioning in the vicinity of the plasma source an extraction electrode that is at a potential relative to the ion source selected to establish an accelerating electric field between the plasma source and the extraction electrode to accelerate ions to the selected energy; producing a magnetic field in the region of the plasma source and the extraction electrode and over a region selected to deflect accelerated ions from the source corresponding to the selected species about an angular beam path trajectory of at least ninety degrees before the deflected ions are outside of the magnetic field; positioning analyzing slits in the ion beam path outside of the magnetic field to produce an ion beam suitable for implantation corresponding to the selected species and the selected energy; and scanning a workpiece through the suitable ion beam which has passed through the analyzing slits to achieve a substantially uniform exposure of the workpiece surface to the beam.

Embodiments of the invention may include one or more the following features.

The magnetic structure preferably comprises an electrically conductive coil and an energizing source coupled to the coil for producing a static, substantially uniform magnetic field between the pole faces of the magnetic structure. The ion plasma source preferably comprises an arc chamber for receiving a source gas corresponding to the ion species selected for implantation, a filament, and a reflector cathode spaced apart from the filament. The filament and the reflector cathode are preferably positioned outside of the arc chamber. In some embodiments, the ion source extends through a small aperture in one of the pole faces and into the magnetic deflection gap. In some other embodiments, the ion source extends between the pole faces of the magnetic structure to a region outside of the magnetic deflection gap.

In certain preferred embodiments, the magnetic structure is energized to produce a static, substantially uniform magnetic field of magnitude H (gauss) and the size of the magnetic structure is selected to accommodate an ion beam trajectory with a beam radius R (cm) selected according to $$RH = 144 \left( \frac{ME}{q} \right)^{1/2}$$

wherein M is the mass of the selected ion species, E is the ion energy (eV), and q is the unit charge of the selected ion species (an integer value).

Analyzing slits are preferably positioned to intercept the ions after exiting the magnetic deflection gap. The distance of analyzing slits from the location where the ions exit the magnetic deflection gap is $$D = \frac{R}{\tan\phi}$$

wherein R is the radius characteristic of the ions traveling in the magnetic deflection gap and $\phi$ is the angular trajectory traveled by the ions from the ion source to the location where the ions exit the magnetic deflection gap. The value of $\phi$ is preferably between 120 degrees and 160 degrees.

The invention is particularly suited for producing ion beams of an energy between 1 keV and 10 keV. In a preferred embodiment, the ion beam has a beam current that is substantially constant for ion energies between 1 keV and 10 keV.

In some embodiments, a cluster tool coupled through a valve to the stage of the ion implanting apparatus. The cluster tool preferably includes a robot arm for loading a workpiece onto and off of the stage.

In some embodiments, a second apparatus is provided for implanting the substrate with a second ion beam of a selected species and a selected energy, the second apparatus comprising a source of a second ion beam, the second apparatus being positioned to deliver the second ion beam along a path that intersects the surface of a substrate mounted on the stage. The second implanting apparatus preferably includes an accelerator positioned to receive the second ion beam from the source for accelerating ions in the second beam to a selected energy greater than the selected energy of the first ion beam.

Embodiments of the invention may include one or more of the following advantages. By achieving a high level of charge neutralization, high ion beam currents can be achieved down to an energy level of, e.g., 1 keV. Furthermore, an implanter designed according to the invention is relatively compact in size. This significantly reduces manufacturing and operating costs. The small size achievable by the invention allows it to be practically incorporated into a cluster tool, enabling certain processes to be performed entirely under vacuum conditions. It is also possible to combine such an implanter with a traditional high energy, high current ion implantation system to perform high energy implantation and low energy implantation concurrently. Furthermore, the high level of charge neutralization substantially reduces charge build-up on a substrate surface during implantation, increasing process yield. Thus, the novel implanter disclosed herein does not require alternative measures to prevent such charge build-up.

Other features and advantages will become apparent from the following description and from the claims.

DESCRIPTION

FIGS. 3 and 3A are diagrammatic cross-sectional side views of an alternative ion source positioned in a magnetic deflection gap defined between two pole faces of a magnetic structure.

FIG. 4 is a diagrammatic cross-sectional side view of an ion source including a plasma source and an extraction electrode.

FIG. 4A is a diagrammatic side view of the trajectories of ions leaving the plasma source of FIG. 4.

FIG. 7 is a plot of ion beam current as a function of ion beam energy for the ion implantation system of FIG. 1.

STRUCTURE

Figure 1:
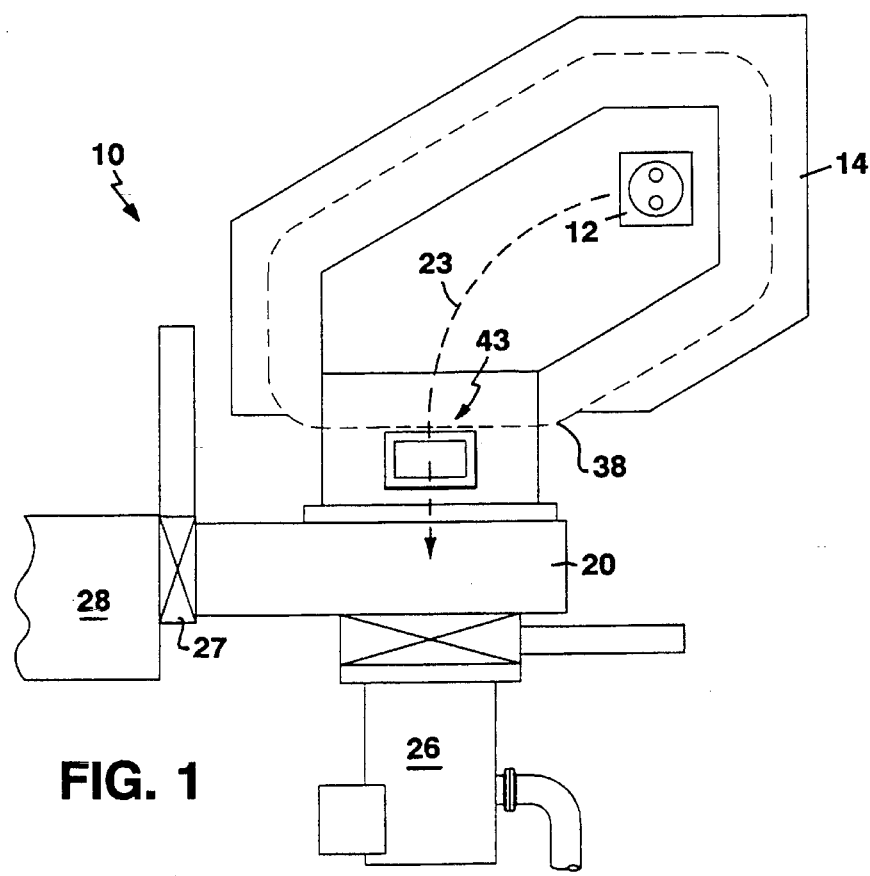
FIG. 1 is diagrammatic side view of an ion implantation system.
Figure 1A:
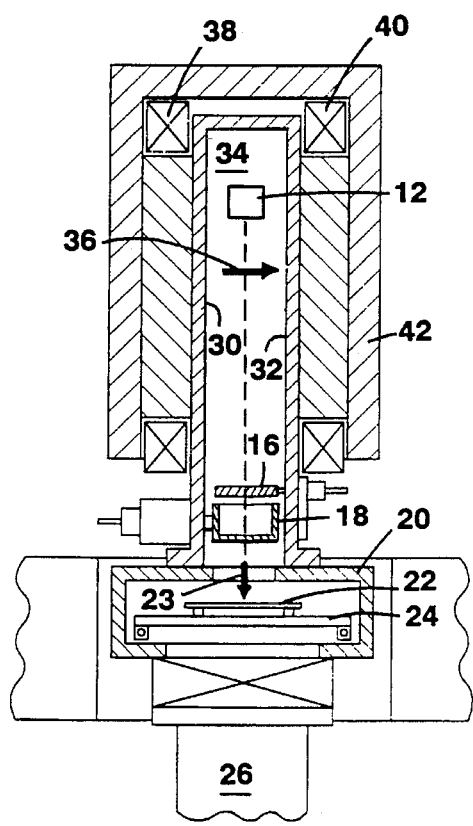
FIG. 1A is a diagrammatic cross-sectional side view of the ion implantation system of FIG. 1.

Referring to FIGS. 1 and 1A, an ion implantation system 10 includes an ion source 12 positioned inside a magnetic structure 14, analyzing slits 16, a movable Faraday cage 18, and an end station 20 containing a workpiece 22 (e.g., a substrate such as a semiconductor wafer) to be treated with an ion beam 23. To achieve uniform irradiance of the workpiece to the ion beam, the workpiece sits on a stage 24 that mechanically scans the workpiece through the beam, either by reciprocal motion of the workpiece or by a combination of reciprocal motion and rotation about an axis. Faraday cage 18 is selectively moved to intercept ion beam 23 (shown in phantom) from source 12 and to determine the beam current for calibration. A pump 26 evacuates the ion implantation system down to a pressure of about $10^{-6}$ Torr, which is suitable for transport of an ion beam. Ion implantation system 10 is coupled to a cluster tool 28 by a valve 27, which is described in detail below. In a presently preferred embodiment for implanting boron ions with a beam current of about 12 mA, the overall size of the implantation system 10 is on the order of 30 inches in length by 30 inches in height by 30 inches in width.

Magnetic structure 14 includes two pole faces 30, 32 that define a magnetic deflection gap 34. A magnetic field 36 is produced in the deflection gap by a pair of coils 38, 40. In a presently preferred embodiment, coils 38, 40 are energized by a power source to produce a static, substantially uniform magnetic field in the deflection gap (although a time-varying magnetic field may be advantageous in certain designs). A return yoke 42 provides a magnetically permeable path for passage of return flux generated by the coils. Ion beam 23 is extracted from ion source 12 and deflected by the magnetic field produced in magnetic deflection gap 34 through an angular trajectory of at least 90° before the ion beam reaches an ion exit region 43, where ions exit the magnetic structure.

Figure 2:
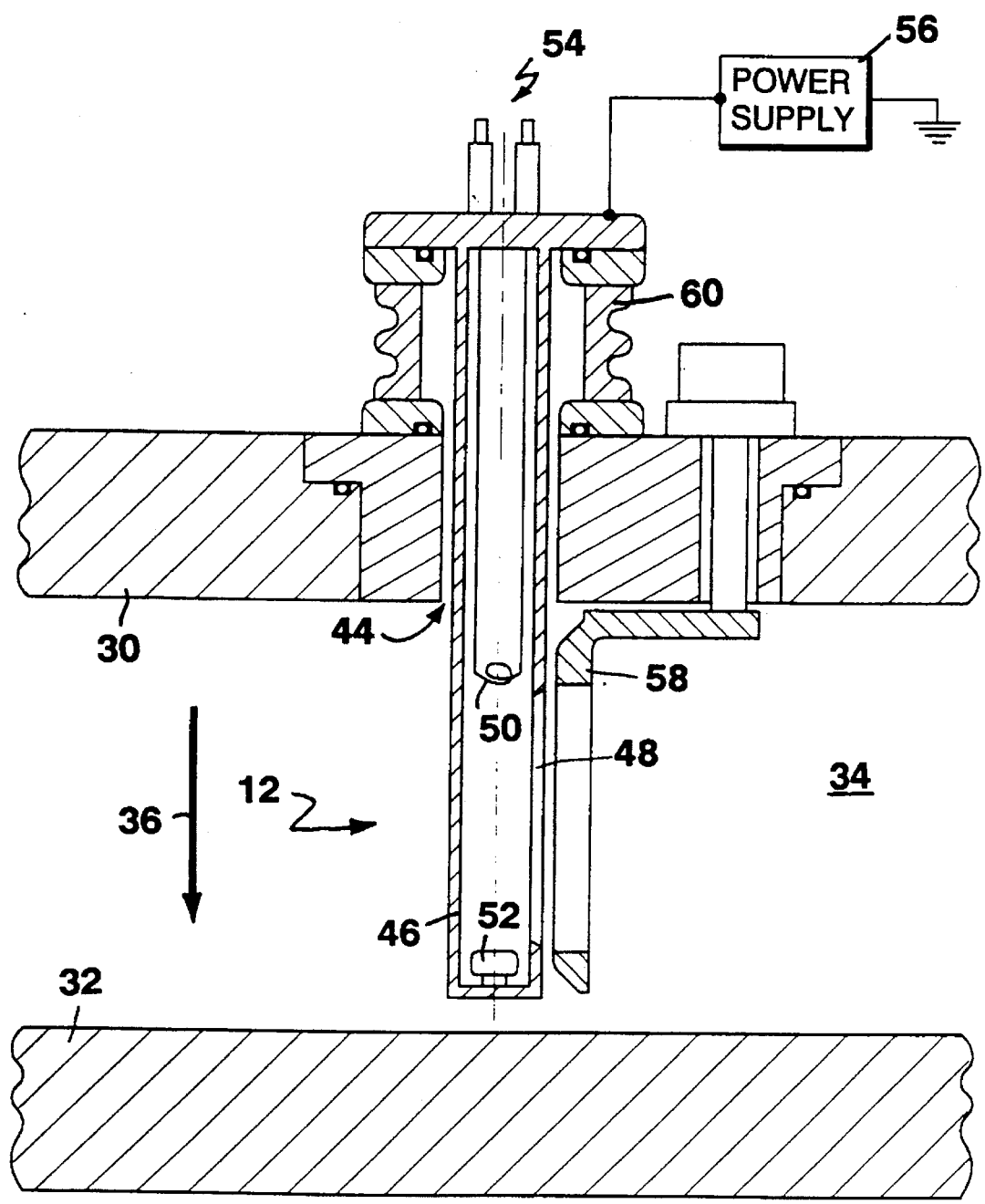
FIG. 2 is a diagrammatic cross-sectional side view of an ion source including an ion plasma source and an extraction electrode positioned in a magnetic deflection gap defined between two pole faces of a magnetic structure.

Referring to FIG. 2, in one embodiment, ion source 12 is inserted into deflection gap 34 through an aperture 44 in pole face 30. The ion source includes an ion arc chamber 46 with an elongated ion exit aperture 48, a filament 50, and a reflector cathode 52 spaced from the filament. The exit aperture has dimensions of about 5–10 cm in length by 2 mm in width. Filament 50 is energized by applying a high current at a low voltage across leads 54, which heats the filament to a high temperature so that it emits thermoelectrons. The filament is usually clamped to a voltage of about –80 V relative to the arc chamber. For producing a positively-charged ion beam, a power supply 56 applies a potential of 1–50 kV, and preferably 1–10 kV, to the arc chamber relative to an extraction electrode 58 and pole faces 30, 32, which are all maintained at ground potential. The reflector cathode either is biased to the same potential as the filament or is left floating. When power is fed to the filament, the filament temperature increases until it emits electrons that bombard source gas molecules inside arc chamber 46 corresponding to the ion species to be implanted. The emitted electrons break-up the source gas molecules so that a plasma is formed containing electrons and various ions. The diffuse through the source chamber to exit aperture 48 and are subsequently accelerated toward extraction electrode 58. An insulator 60 supports the ion source and prevents electrical communication between the ion source and pole faces 30, 32. Insulator 60 is made of high temperature ceramic material, e.g., aluminum oxide.

Referring to FIGS. 3 and 3A, in an alternative embodiment, ion source 12 is inserted into magnetic deflection gap 34 from one side. In this embodiment, a filament 70 and a cold reflector cathode 72 are positioned outside and on opposite sides of a arc chamber 74. Ions produced inside the arc chamber leave through an exit aperture 76, which has dimensions of about 5–10 cm in length and 2 mm in width. A gas feed tube 78 supplies a source gas (e.g., $BF_3$ or $PH_3$) or a vapor (e.g., a vapor of P or As) corresponding to the selected ion species through a gas inlet port 80 and into the arc chamber. The filament and the cold reflector cathode are insulated from arc chamber 74 by respective insulation 82, 84. The filament and the reflector cathode are spaced from the arc chamber and are positioned in the vicinity of apertures 86, 88, which are made small to avoid loss of source gas from the arc chamber. For producing a positively-charged ion beam, the arc chamber is biased to a potential of 1–50 kV, and more preferably 1–10 kV relative to ground potential. A power supply energizes the filament with a high current (e.g., about 100 A) and at a negative voltage relative to the voltage applied to the arc chamber so that electrons are emitted from the filament. The reflector cathode is biased at the same potential as the filament and serves to confine electrons within the arc chamber. The filament and the reflector cathode are biased through leads 90, 92, which are respectively cooled by water-cooled squirt tubes 94, 96. An extraction electrode 98, which is held at ground potential, is positioned in the vicinity of exit aperture 76 and serves to shape and to accelerate the ion beam exiting the arc chamber.

Referring to FIG. 4, in a generalized ion source embodiment 12, an ion plasma 100 is generated within an arc chamber 102, which is biased to a selected voltage relative to an extraction electrode 106 (e.g., 1–50 kV for producing a positively-charged ion beam). The ions leave the arc chamber through an elongated exit aperture 104 and form a beam 105 that is subsequently accelerated by electric fields established in the region between the exit aperture and extraction electrode 106, which is held at ground potential. The ion source has either a real or a virtual line source geometry close to exit aperture 104, depending on the curvature of the plasma meniscus 108. If the plasma meniscus has a concave shape at the exit aperture, as shown in FIGS. 4 and 4A, the source appears as a real line source 110 close to and in front of the exit aperture. If the plasma meniscus has a convex shape, the source appear as a virtual line source close to and behind the exit aperture. The degree of divergence of ion beam 105 is determined by the shape of the plasma meniscus, which in turn depends on the emittance of the ion source and the geometry of the extraction region. In a presently preferred embodiment, the ion source beam appears to come from a small real object 110 of about 1 mm in size and a spread of trajectory angles of about a median ray 112. The angular spread is usually not less than ±0.04 radians about the mean ion trajectory (±2.3°).

Figure 5:
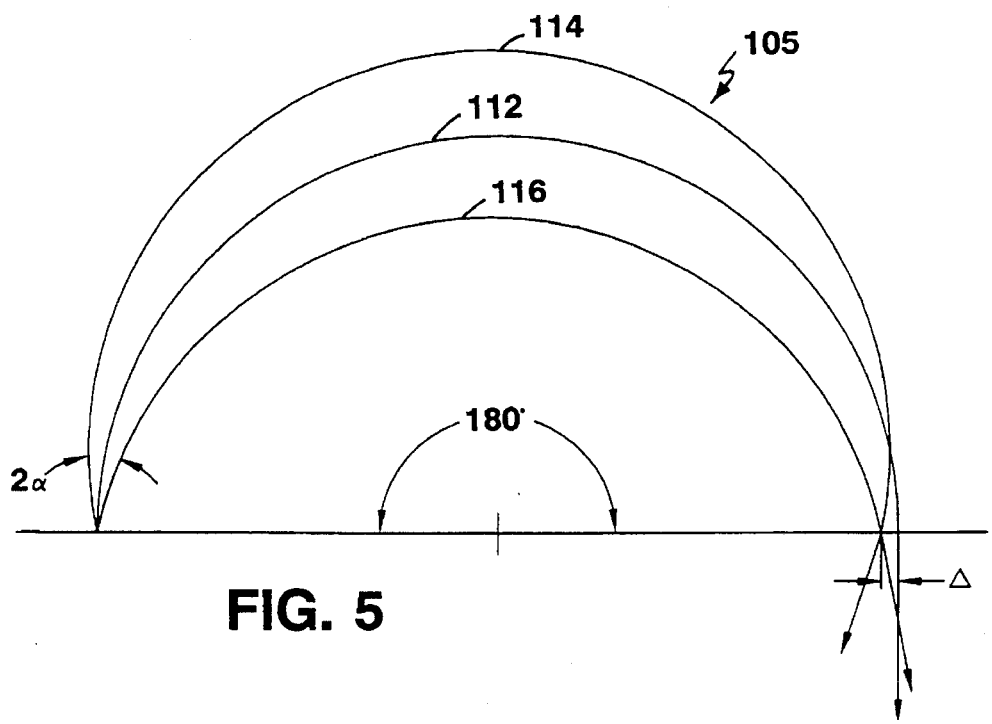
FIG. 5 is a diagrammatic view of the trajectories of ions leaving an ion source positioned in a static, substantially uniform magnetic field.

As shown in FIG. 5, ion beam 105 travels along an arc of a circular trajectory when exposed to a static, uniform magnetic field. The radius (R in cm) of the ion trajectory is depends on the magnetic field strength (H in gauss), the ion energy (E in eV), the ion's mass (M in amu), and the unit charge of the ion (q, an integer):

$$R = \frac{144}{H} \left( \frac{ME}{q} \right)^{1/2} \qquad (2)$$

If median ray 112 proceeds through 180° before exiting the deflection gap of the magnet, the rays will come into focus, as shown. Ion beam rays 114, 116 at the boundaries of the ion beam envelope do not focus at the same location as median ray 112. The focusing aberration (Δ) is determined by $$\Delta = \alpha^2 R \qquad (3)$$

This aberration is correctable by appropriate shaping of the magnetic field (see, e.g., "Electromagnetic separation of isotopes in commercial quantities," TID 5211, Ed. R. K. Wakerling and A. Gutherie, which is herein incorporated by reference).

Figure 6:
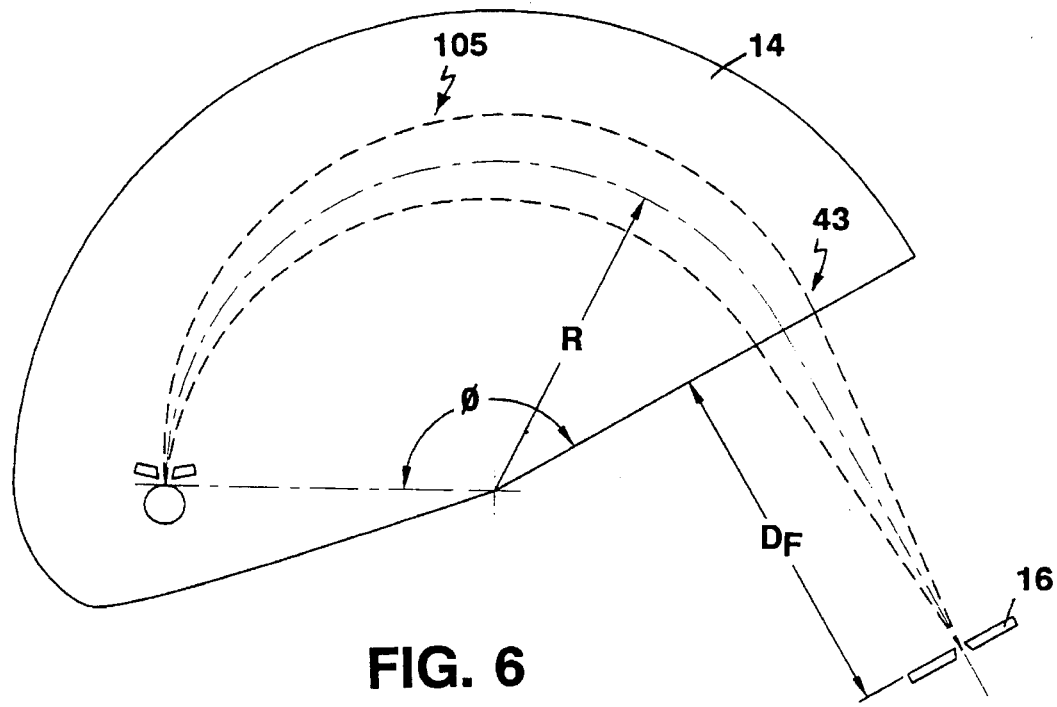
FIG. 6 is a diagrammatic top view of an ion source, a magnetic structure, and analyzing slits.

Referring to FIG. 6, in a presently preferred embodiment, magnetic structure 14 is shaped so that ion beam 105 exits the deflection gap after proceeding along an angular trajectory ($\phi$) of at least 90°, preferably between 120° and 160°, and more preferably about 135°. The distance $D_f$ of the focal position from the exit of the deflection gap (magnetic field boundary), for this system, is given by $$D_f = \frac{R}{\tan\phi} \quad (4)$$

For $\phi=135°$, the distance ($D_f$) between the exit of the deflection gap and the focal position is about 20 cm. For a 5 keV beam of boron ions each with an atomic mass of eleven and a trajectory radius of 20 cm, a magnetic field of about 1688 gauss is required, according to equation (2). This field magnitude is easily achievable. In fact, fields of 20 kilogauss or greater can be obtained in properly designed magnets for use with heavier ion beams.

Analyzing slits 16 are located at the focal position. In a presently preferred embodiment, designed for ion implantation of silicon wafers, the analyzing slits are made of silicon to reduce contamination of the wafers by sputtered material from the analyzing slits. To achieve a uniform magnetic field along the ion beam trajectory, the magnet is sized so that the median ray of the ion beam is spaced from the edges of the magnet by at least about 150% of the height of the deflection gap. The size of the magnet may be made smaller, if the magnet is shaped or contoured in a manner that compensates for the effects of fringing fields at the edges of the magnet.

Ions corresponding to the selected charge-to-mass ratio are focused by the magnetic field in the deflection gap through the analyzing slits after which they impact the wafer for implantation. Ions of a substantially different charge-to-mass ratio will not pass through the deflection gap and be focused either to the left or to the right of the analyzing slits, and thus selected out of the beam impacting the substrate.

In the presence of a static, substantially uniform magnetic field, electrons generated within the source follow helical paths. These electrons are primarily liberated by collision of gas molecules with high speed positive ions. By collision of a high-speed ion with a gas molecule, either an electron or an electron and a slow positive ion are created. The electron cannot leave the beam region so long as the positive potential of the region differs from the potential of the walls by more than the kinetic energy of the electrons. When the kinetic energy of the electrons exceeds the potential difference between the beam region and the pole faces, they can escape. Electrons will therefore tend to accumulate in the beam region until its potential is brought down to a value comparable to the kinetic energy with which the electrons are created. Since some electrons will be created with very low energies, these electrons will be retained in exchange for more energetic ones, and the space-charge potential will eventually approach the potential of the pole faces of the magnetic structure. The positive ions that are created will be expelled from the region and cannot accumulate. The retained electrons neutralize the ion beams moving in the magnetic field to better than 99%. Therefore, in the path from the ion source to the focal position, the beam is essentially unaffected by space charge. The superior space-charge neutralization achievable by the present invention enables production of ion beams of low energy at high current density. Referring to FIG. 7, it is believed that beams produced by the invention will have a substantially constant beam current for ion beam energies between 10 keV to below 1 keV.

Figure 8A:
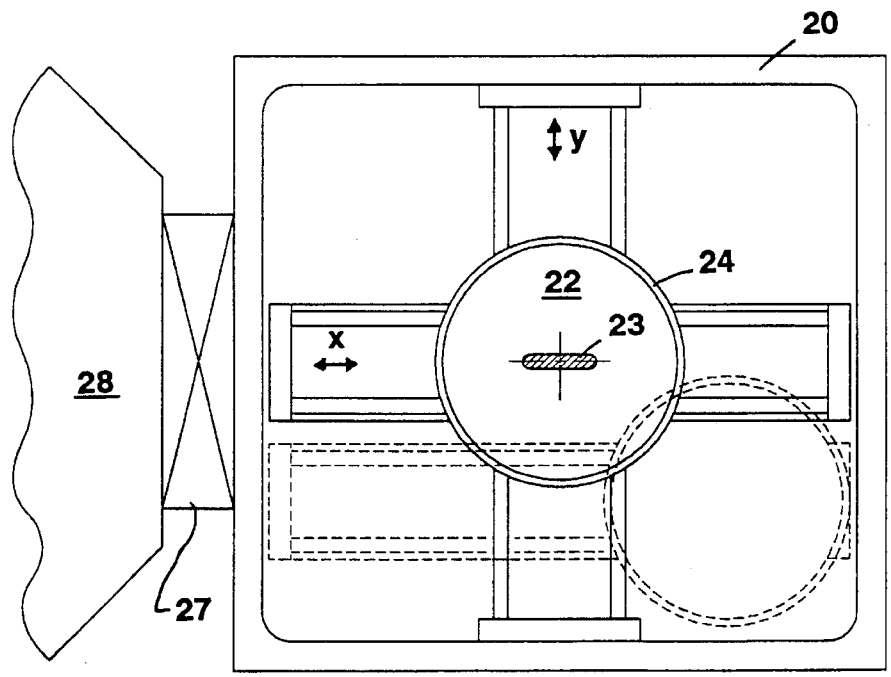
FIGS. 8 and 8A are diagrammatic side and top views of an end station of the ion implantation system of FIG. 1.
Figure 8:
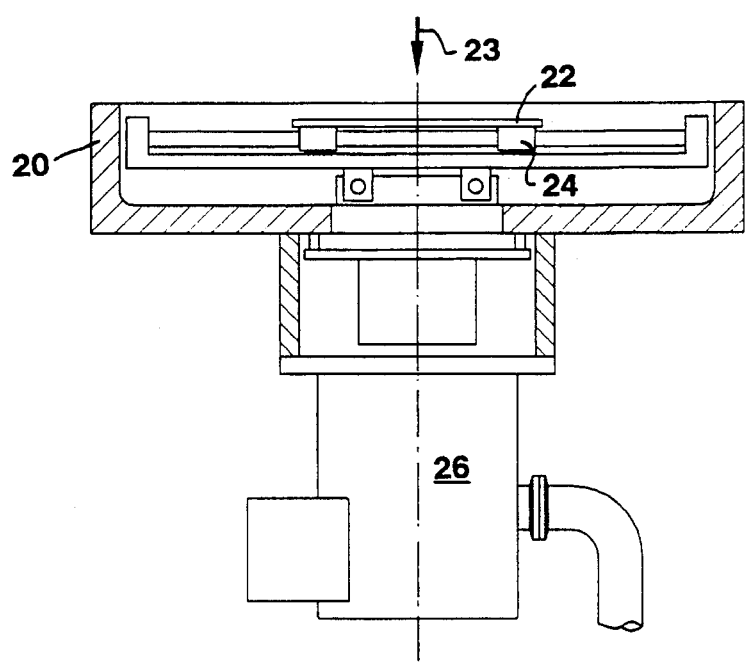

Referring to FIGS. 8 and 8A, in a presently preferred embodiment, end station 20 includes a stage 24 that is movable in orthogonal directions (X and Y axes). Ion beam 23 has an elongated transverse cross-section with the elongated axis parallel to the X-axis, as shown. The motion of stage 24 is controlled by a processor so that the velocity of the stage in the Y direction is proportional to the ion beam current; the stage is incrementally stepped in the X-direction after each Y sweep.

Figure 9:
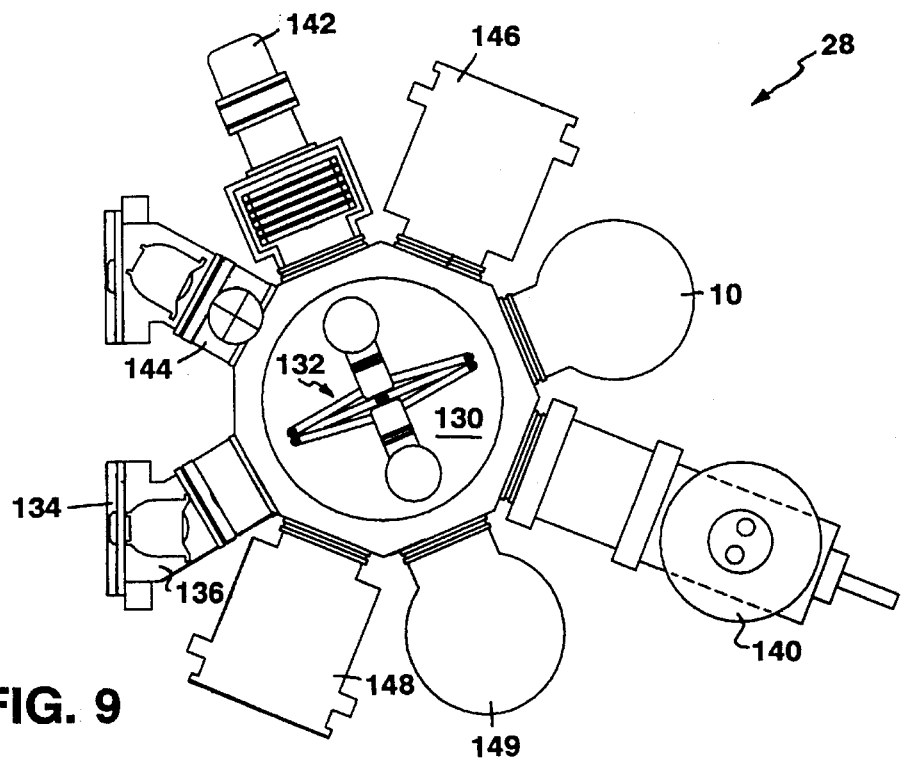
FIG. 9 is a diagrammatic top view of a cluster tool coupled to the ion implantation system of FIG. 1 and further coupled to one or more additional processing systems.

Referring to FIG. 9, cluster tool 28 includes several process tools circumferentially spaced about a central substrate positioning chamber 130, which is at a pressure of about $10^{-6}$ Torr. A sequence of process steps is choreographed by a computer-controlled robot arm 132 (e.g., one available from Brooks Automation of Lowell, Mass., U.S.A.) in the substrate positioning chamber. Each process tool has an independent processing environment separated from the central chamber by respective gate valves. Substrates are loaded into the cluster tool through a load lock 134, which has an intermediate chamber 136 that is pumped down to less than $5\times10^{-6}$ Torr.

In a presently preferred embodiment, ion implantation system 10 is coupled to the cluster tool (additional ion implantation systems of the kind shown in FIG. 1 may be coupled to the implanter depending on the desired process to be implemented). The small size of ion implantation system 10 allows it to be coupled to a process tool in a practical manner. Other process tools may include one or more of the following: a substrate cleaning station 140 (e.g., an argon aerosol cleaner, as described in U.S. Ser. Nos. 08/335,329 and 08/335,327, both filed on Nov. 7, 1994, which are herein incorporated by reference); a degas system 142; a wafer align and centering station 144; an etching station 146; a resist asher 148; and a second ion implanter 149, which is of the same construction as implanter 10 and arranged to implant, e.g., ions of the same species as implanter 10 to increase throughput of wafers through the cluster tool.

Other embodiments are within the scope of the claims.

Figure 10:
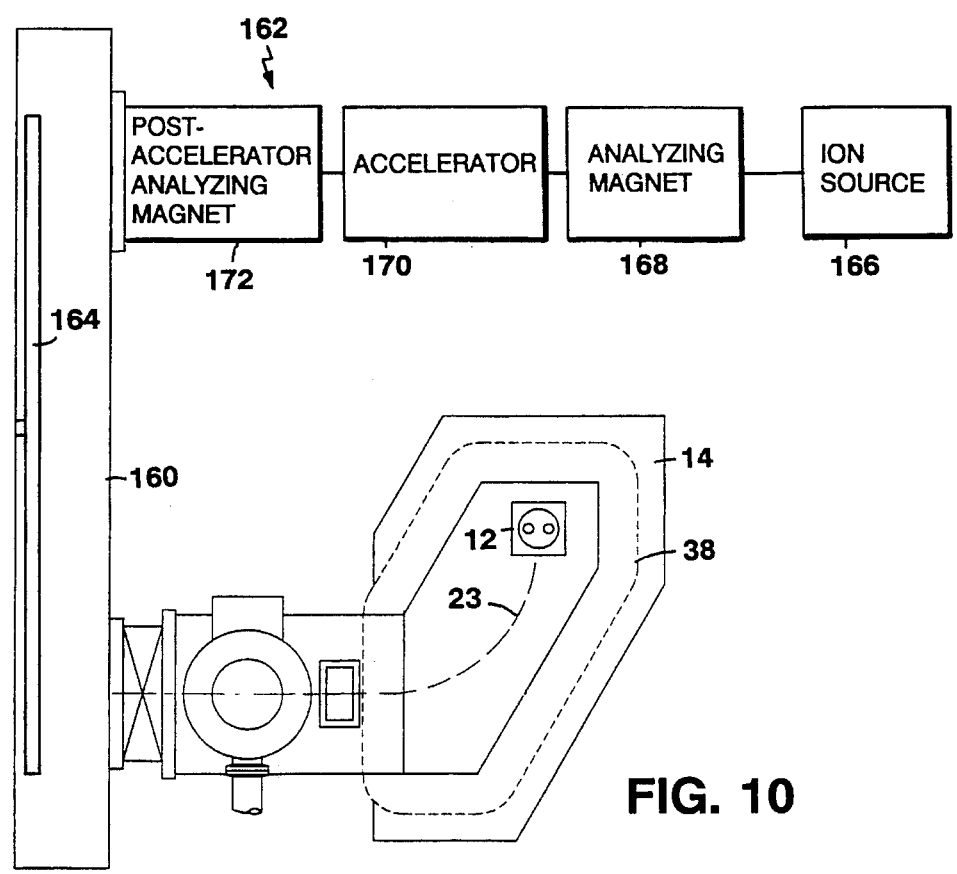
FIG. 10 is a diagrammatic side view of the ion implantation system of FIG. 1 and a second, high energy ion implantation system coupled to the same end station.

Referring to FIG. 10, ion implantation system 10 is coupled to an end station 160 along with a high energy, high current ion implantation system 162 (e.g., a NV10-160 Pre-Dep™ ion implanter available from EATON Corporation). This embodiment provides the ability to simultaneously implant ions at high and at low energies and at high currents. A plurality of substrates are loaded onto a stage 164 that is mechanically scanned through the beams generated by the different implantation systems. The high energy, high current ion implantation system includes an ion source 166, an analyzing magnetic 168, an accelerator module 170, and a post-accelerator analyzing magnet 172.

Figure 11:
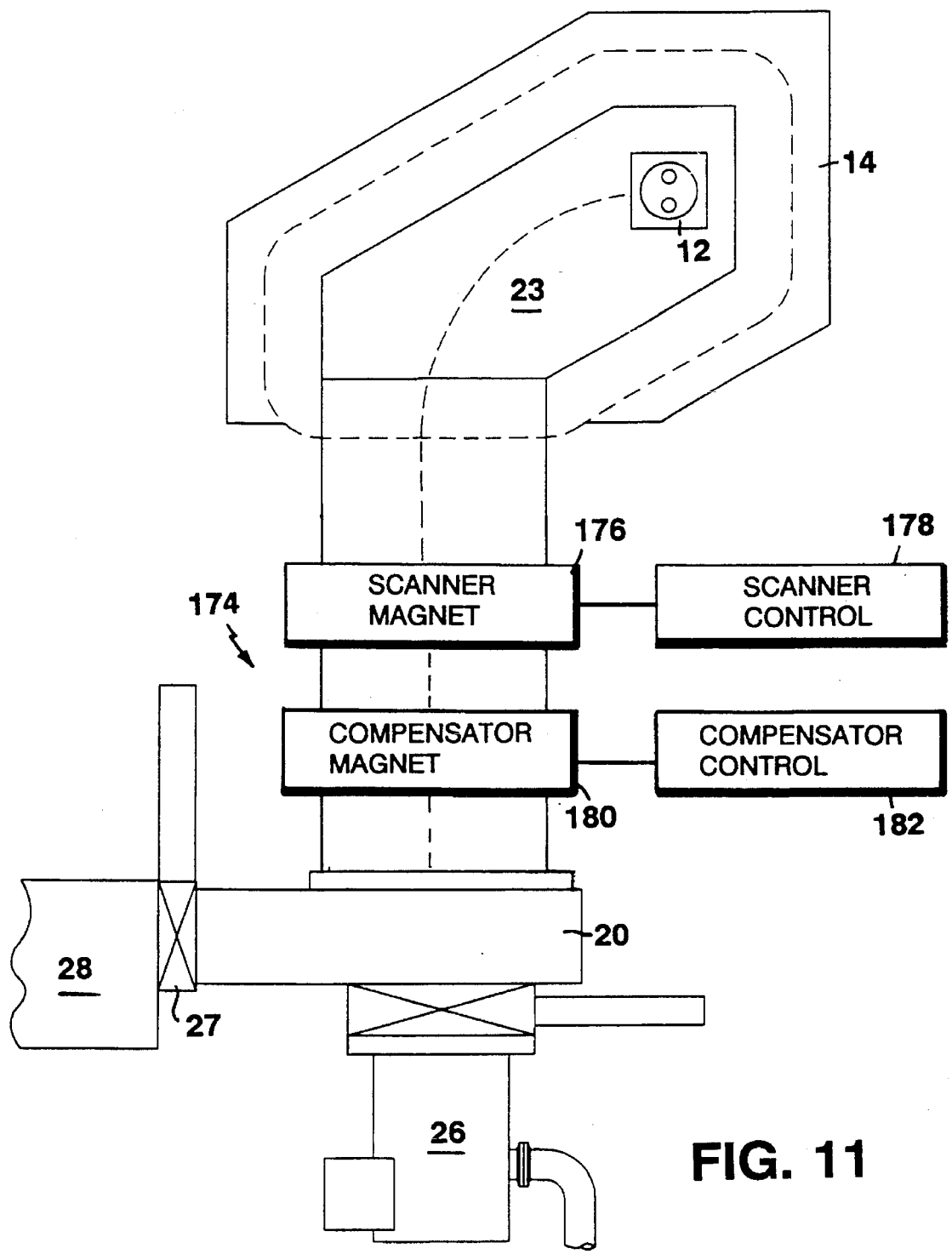
FIG. 11 is a diagrammatic side view of the ion implantation of FIG. 1 including a magnetic deflection system for scanning an ion beam.

As shown in FIG. 11, another embodiment, instead of mechanically scanning a substrate through an ion beam in two dimensions, the substrate is scanned in one dimension, while the ion beam is scanned in the other direction by a beam deflector 174, as shown in FIG. 11. In a presently preferred embodiment, beam deflector 174 includes a scanner magnet 176 controlled by a scanner control 178 and a compensator magnet 180 controlled by a compensator control 182 (e.g., as described in WO 93/17445, published Sep. 2, 1993, to H. F. Glavish, which is herein incorporated by reference). The scanner and compensator magnets are energized by respective high frequency power sources.

APPLICATIONS

EXAMPLE 1

In the biasing arrangements described above (FIGS. 2, 3, and 3A) for ion implantation system 10, we assume that ion beam 23 consisted of positive ions. Negative beams of negative ions such as boron are produced by the same ion implantation system by applying an opposite potential to the ion source chambers and by slight modification of the ion sources to convert them into direct extraction negative ion sources. For a 5 keV beam of boron ions, the arc chamber is biased to a voltage of −5 kV and the extraction electrode is held at ground potential, in which case negative boron ions can be extracted from the arc chamber. Negative ions may be implanted into semiconductor device structures that are particularly sensitive to charge build-up. Under certain conditions, it is speculated that they may be less contamination of the workpiece with negative ion beams than with positive ion beams.

EXAMPLE 2

The ion implantation system of FIG. 10 is preferably used to implant ion beams (of the same or different species) of different energy into one or more substrates at the same time. For example, it may be desirable to implant ions over a wide range of depths in a substrate (e.g., 1 keV to 200 keV). This embodiment would take advantage of the throughput efficiency of each machine to achieve high throughput results. Alternatively, it may be desirable to implant two different species into a substrate at different respective depths. This embodiment provides faster process times because the two implantation steps are performed at the same time.

EXAMPLE 3

Figure 12:
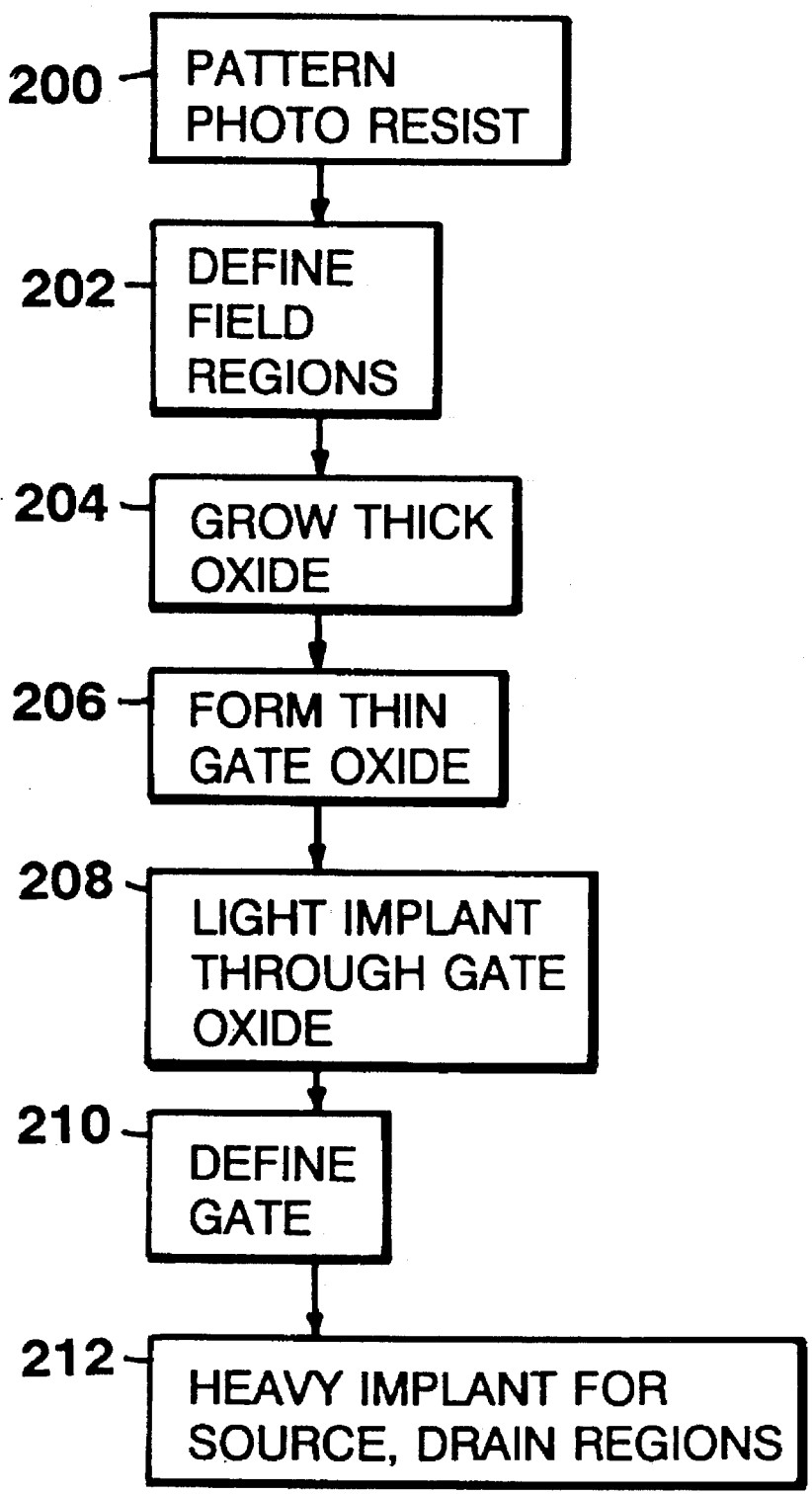
FIG. 12 is a flow diagram of a method for processing a semiconductor wafer.
Figure 13A:
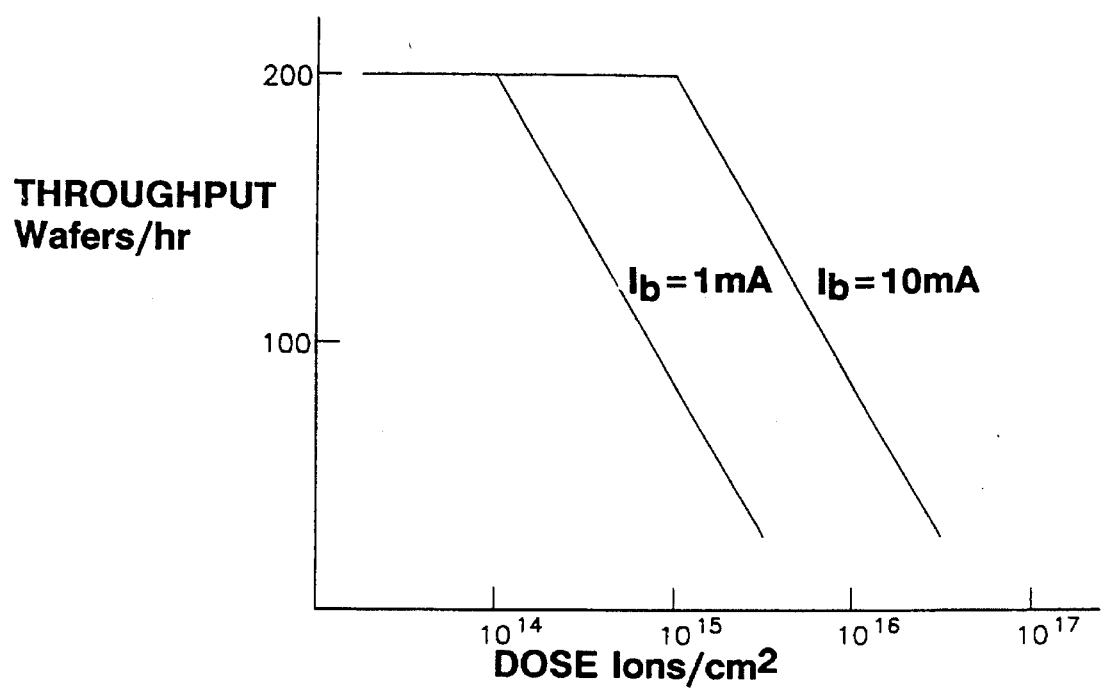
FIG. 13A is a plot of wafer throughput as a function of dose for two different ion beam current levels in a typical high energy ion implantation system.
Figure 13:
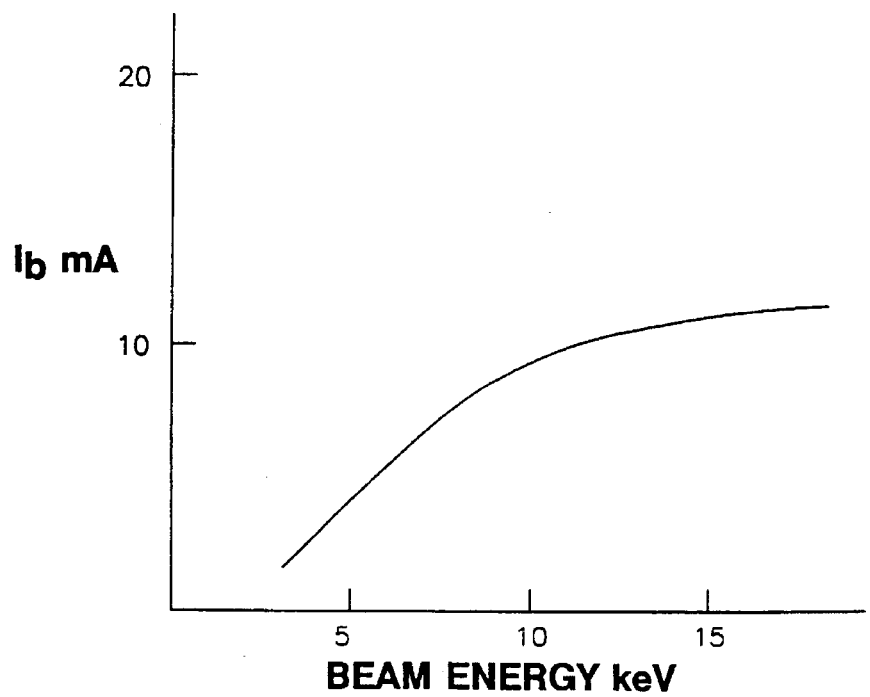
FIG. 13 is a plot of ion beam current as a function of beam energy for a typical high energy ion implantation system.

Referring to FIG. 12, in one embodiment, a conductor-insulator-silicon integrated circuit is formed from the following sequence of process steps using the cluster tool processing system of FIG. 9. A photoresist layer is patterned on the surface of a P-type silicon wafer (200). the wafer is lightly implanted with P-type material (e.g., boron) using implanter 10 to define the field regions (202). This field implant provides greater electrical isolation between the active device regions. Thick oxide regions are grown between the active device regions using thermal oxide furnace 148 (204). After masking regions overlying the active device regions are removed, a thin gate oxide layer is grown using furnace 148 (206). The substrate is then lightly implanted with N-type material (e.g., phosphorus) using a different ion implanter of the kind shown in FIG. 1 (208). This light N-type implant tailors the threshold voltage of the gate field effect transistor devices. The gate regions of the field effect devices are then defined by an etching step using an etching tool coupled to the cluster tool (210). Thereafter, the substrate is heavily implanted with N-type ions (e.g., phosphorus) using a high energy implanter 162 to define the source and drain regions of the field effect transistor devices (212).

Still other embodiments are within the scope of the claims.

What is claimed is:

1. An apparatus for implanting ions of a selected ion species and a selected ion energy into a workpiece comprising:

an ion plasma source for generating an ion source plasma from a selected source gas and having an ion exit aperture;

an extraction electrode for extracting and for accelerating ions from the exit aperture of the plasma source, the extraction electrode being positioned in the vicinity of the ion exit aperture of the ion plasma source, the ion source being biased at a potential relative to the extraction electrode to achieve a selected ion beam energy;

a magnetic structure having pole faces that define a magnetic deflection gap therebetween and having an ion exit region where ions exit the magnetic deflection gap, the ion plasma source and the extraction electrode being positioned in the magnetic deflection gap so that when the magnetic structure is energized ions extracted from the plasma source corresponding to the selected species are deflected about an angular beam path trajectory of at least ninety degrees before extracted ions reach the ion exit region and exit the magnetic deflection gap; and a stage for supporting a workpiece and for positioning the workpiece to intercept ions that exit the magnetic deflection gap for achieving implantation of intercepted ions into the workpiece.

2. An apparatus for producing a beam of ions of a selected ion species and a selected ion energy comprising an ion plasma source for generating an ion source plasma from a selected source gas and having an ion exit aperture, an extraction electrode for extracting and for accelerating ions from the exit aperture of the plasma source, the extraction electrode being positioned in the vicinity of the ion exit aperture of the ion plasma source, the ion source being biased at a potential relative to the extraction electrode to achieve a selected ion beam energy, a magnetic structure having pole faces that define a magnetic deflection gap therebetween and having an ion exit region where ions exit the magnetic deflection gap, the ion plasma source and the extraction electrode being positioned in the magnetic deflection gap so that when the magnetic structure is energized ions extracted from the plasma source corresponding to the selected species are deflected about an angular beam path trajectory of at least ninety degrees before extracted ions reach the ion exit region and exit the magnetic deflection gap, and analyzing slits disposed outside of the magnetic structure and positioned to intercept ions that exit the magnetic deflection gap and to selectively pass intercepted ions corresponding to the selected ion species.

3. The apparatus of claim 1 or 2 wherein the magnetic structure comprises an electrically conductive coil and an energizing source coupled to the coil for producing a static, substantially uniform magnetic field between the pole faces of the magnetic structure.

4. The apparatus of claim 1 or 2 wherein the ion plasma source comprises an arc chamber for receiving a source gas corresponding to the ion species selected for implantation, a filament, and a reflector cathode spaced apart from the filament.

5. The apparatus of claim 4 wherein the filament and the reflector cathode are positioned outside of the arc chamber.

6. The apparatus of claim 1 or 2 wherein the ion source extends through a small aperture in one of the pole faces and into the magnetic deflection gap.

7. The apparatus of claim 1 or 2 wherein the ion source extends between the pole faces of the magnetic structure to a region outside of the magnetic deflection gap.

8. The apparatus of claim 1 or 2 wherein the magnetic structure is energized to produce a static, substantially uniform magnetic field of magnitude H (gauss) and the size of the magnetic structure is selected to accommodate an ion beam trajectory with a beam radius R (cm) selected according to $$RH = 144 \left( \frac{ME}{q} \right)^{1/2}$$

wherein M is the mass of the selected ion species (amu), E is the ion energy (eV), and q is the unit charge of the selected ion species (an integer value).

9. The apparatus of claim 1 further comprising analyzing slits disposed between the magnetic structure and the stage and positioned to intercept ions that exit the magnetic deflection gap.

10. The apparatus of claim 2 or 9 wherein the distance of analyzing slits from the location where the ions exit the magnetic deflection gap is $$D = \frac{R}{\tan\phi}$$

wherein R is the radius characteristic of the ions traveling in the magnetic deflection gap and $\phi$ is the angular trajectory traveled by the ions from the ion source to the location where the ions exit the magnetic deflection gap.

11. The apparatus of claim 10 wherein $\phi$ is between 120 degrees and 160 degrees.

12. The apparatus of claim 1 or 2 wherein the ion beam has a beam current that is substantially constant for ion energies between 1 keV and 10 keV.

13. The apparatus of claim 1 further comprising a second apparatus for implanting a substrate with a second ion beam of a selected species and a selected energy, the second apparatus comprising a source of a second ion beam, the second apparatus being positioned to deliver the second ion beam along a path that intersects the surface of a substrate mounted on the stage.

14. The apparatus of claim 13 further comprising an accelerator positioned to receive the second ion beam from the source for accelerating ions in the second beam to a selected energy greater than the selected energy of the first ion beam.

15. The apparatus of claim 1 wherein the stage is constructed and arranged to retain the substrate and to mechanically scan the substrate through the beam to achieve substantially uniform irradiance of the substrate surface by the ions.

16. The apparatus of claim 1 further comprising a cluster tool coupled to the stage through a valve, the cluster tool including a robot arm for loading a workpiece onto and off of the stage.

\* \* \* \* \*

UNITED STATES PATENT AND TRADEMARK OFFICE
CERTIFICATE OF CORRECTION

PATENT NO. : 5,554,853

DATED : September 10, 1996

INVENTOR(S) : Peter H. Rose

It is certified that error appears in the above-identified patent and that said Letters Patent is hereby corrected as shown below:

On title page, item [56] under "Other Publication"
N. Sakudo - listed "vol. 821" - should read "vol. B21"

Torii et al -- listed "vol. 821" - should read "vol. B21"

Col. 1, ln. 24 - listed "key" - should read "keV"

Col. 1, ln. 40 - listed "∈~0.2" - should read "∈≈0.2"

Col. 9, ln. 36 - second occurrence of "the", replace with "The"

Signed and Sealed this

Second Day of December, 1997

BRUCE LEHMAN

*Attest:*

*Attesting Officer*  *Commissioner of Patents and Trademarks*